US009226418B2

(12) United States Patent
Magno, Jr. et al.

(10) Patent No.: US 9,226,418 B2
(45) Date of Patent: Dec. 29, 2015

(54) ELECTRICAL BOX WITH DRIP POINT COMPARTMENTS

(71) Applicant: Thomas & Betts International, Inc., Wilmington, DE (US)

(72) Inventors: Joey D. Magno, Jr., Cordova, TN (US); Michael Devin O'Neil, Germantown, TN (US)

(73) Assignee: Thomas & Betts International, LLC, Wilmington, DE (US)

( * ) Notice: Subject to any disclaimer, the term of this patent is extended or adjusted under 35 U.S.C. 154(b) by 191 days.

(21) Appl. No.: 14/029,961

(22) Filed: Sep. 18, 2013

(65) Prior Publication Data

US 2014/0083734 A1 Mar. 27, 2014

Related U.S. Application Data

(60) Provisional application No. 61/704,089, filed on Sep. 21, 2012.

(51) Int. Cl.
*H05K 5/02* (2006.01)
*H02G 3/08* (2006.01)
*H02G 3/14* (2006.01)

(52) U.S. Cl.
CPC ............ *H05K 5/0221* (2013.01); *H02G 3/088* (2013.01); *H02G 3/083* (2013.01); *H02G 3/086* (2013.01); *H02G 3/14* (2013.01)

(58) Field of Classification Search
USPC ................................... 174/50, 58; 312/223.1
See application file for complete search history.

(56) References Cited

U.S. PATENT DOCUMENTS

| 4,952,753 | A | 8/1990 | Hayashi et al. |
| 5,159,155 | A | 10/1992 | Nishihara |
| 5,239,129 | A | 8/1993 | Ehrenfels |
| 5,954,525 | A | 9/1999 | Siegal et al. |
| 6,046,904 | A | 4/2000 | Kubat |
| 6,610,927 | B2 | 8/2003 | Dinh et al. |
| 6,835,890 | B2 | 12/2004 | Dinh et al. |
| 6,982,379 | B2 | 1/2006 | Saka et al. |
| 7,156,677 | B2 | 1/2007 | Yamane |
| 7,253,356 | B2 | 8/2007 | Kiyota et al. |
| 7,950,931 | B2 | 5/2011 | Nakanishi et al. |
| 8,013,242 | B1 | 9/2011 | Thibault et al. |
| 8,047,491 | B2 * | 11/2011 | Gutierrez ...................... 248/300 |
| 8,309,847 | B2 * | 11/2012 | Aburaya et al. ................. 174/50 |
| 2011/0240363 | A1 | 10/2011 | Dinh |
| 2012/0133144 | A1 | 5/2012 | Barton et al. |

* cited by examiner

*Primary Examiner* — Dhirubhai R Patel
(74) *Attorney, Agent, or Firm* — Snyder, Clark, Lesch & Chung, LLP

(57) ABSTRACT

An equipment enclosure includes a first compartment; a second compartment, the first compartment including a first element to guide a conduit from the first compartment to the second compartment, wherein the first element creates a first drip point with respect to the conduit that prevents a liquid from entering the second compartment; and a third compartment including a second element to guide another conduit from the third compartment toward the second compartment, wherein the second element creates a second drip point with respect to the other conduit that prevents a liquid from reaching the second compartment.

20 Claims, 17 Drawing Sheets

ELECTRICAL BOX WITH DRIP POINT COMPARTMENTS

CROSS-REFERENCE TO RELATED APPLICATION

This application claims priority under 35 U.S.C. §119, based on U.S. Provisional Patent Application No. 61/704,089, filed on Sep. 21, 2012, the disclosure of which is hereby incorporated by reference herein.

BACKGROUND

An electrical box, such as a function shallow (FS) box or a function deep (FD) box, can be used in various facilities to house receptacles. A conduit system connects to the electrical box to supply wires. In a facility, the electrical box may be subjected to an environmental condition that may lead to condensation accumulating on the electrical box. Additionally, or alternatively, the electrical box may be subjected to water, liquids, and/or stringent cleaning solutions. For example, personnel at a facility may rinse or wash down a wall (e.g., with a direct, high pressure spray) on which the electrical box is surface-mounted, causing the electrical box to become exposed to water, etc.

DETAILED DESCRIPTION OF PREFERRED EMBODIMENTS

Figure 1:
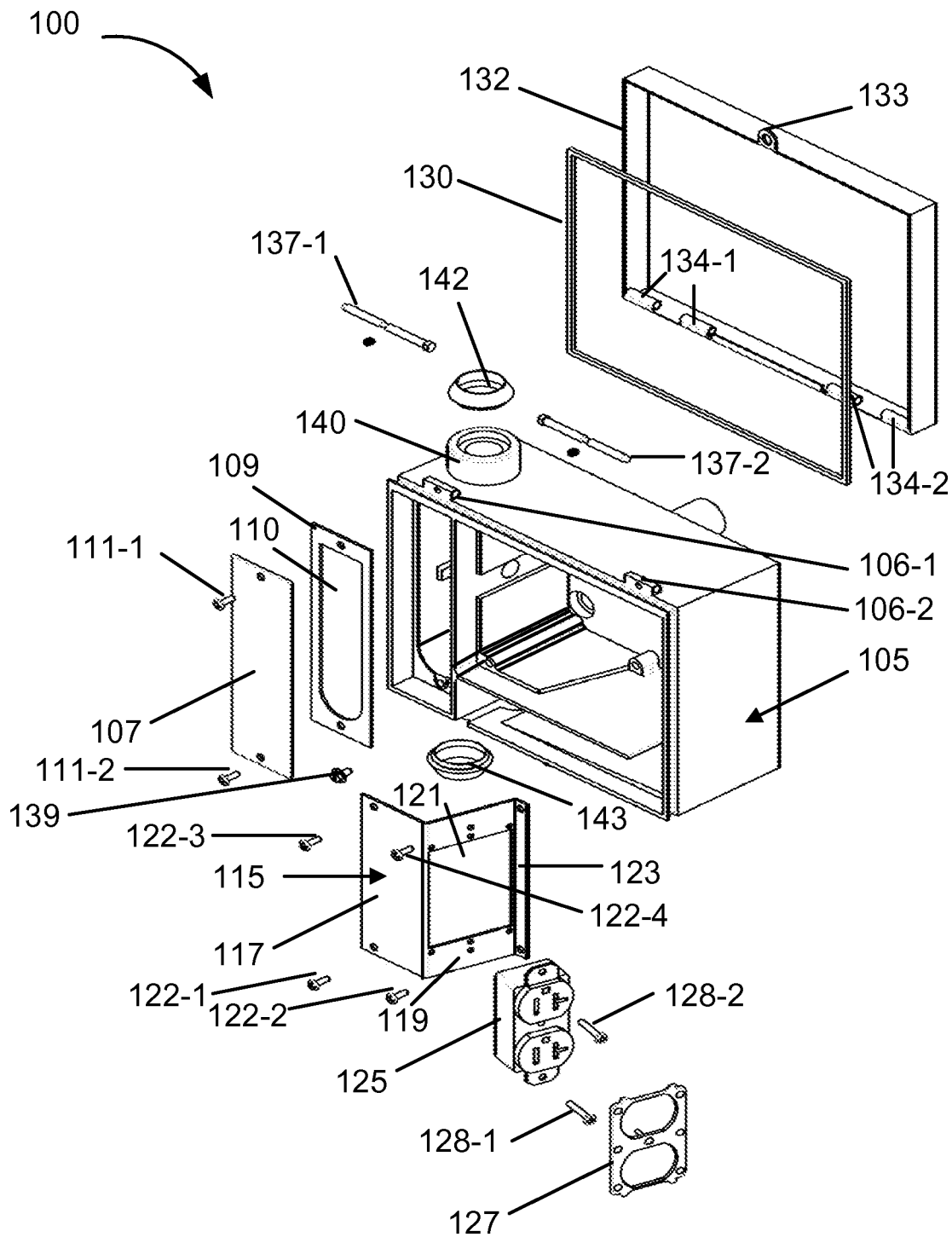
FIG. 1 is a diagram illustrating an exploded view of an exemplary embodiment of an electrical box.

The following detailed description refers to the accompanying drawings. The same reference numbers in different drawings may identify the same or similar elements.

In the specification and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s).

A current set-up of an electrical box that houses a receptacle includes a power source T-connection, which is positioned lower than the electrical box, and a conduit connecting the electrical box to the T-connection. Typically, the T-connection has a drain fitting at a bottom connection to allow facility personnel to drain liquid from the T-connection.

According to an exemplary embodiment, an electrical box includes a conduit compartment and a device compartment. According to an exemplary embodiment, the conduit compartment includes a conduit guide wall. The conduit guide wall is positioned within an area of the conduit compartment to cause a conduit to be guided within the conduit compartment and fed through a hole leading to the device compartment. Based on the conduit guide wall, a drip point is created with respect to the installed conduit from which water or condensation may drip and exit the electrical box. According to an exemplary embodiment, based on the conduit guide wall, the drip point is at a location that is lower than the hole leading to the device compartment. In this way, water and condensation is unable to reach the device compartment.

According to an exemplary embodiment, an electrical box includes a plug compartment that is adjacent to the device compartment. According to an exemplary embodiment, the plug compartment includes a guide wall. The guide wall is positioned within the plug compartment to cause a conduit to be guided within the plug compartment toward a receptacle of the device compartment. Based on the guide wall, a drip point is created with respect to the installed conduit from which water or condensation may drip and exit the electrical box. According to an exemplary embodiment, the plug compartment includes a sloped wall. The sloped wall provides a path for water and condensation to travel and exit the electrical box.

In view of the foregoing, the electrical box described herein may simplify installation for an installer and minimize resource utilization (e.g., labor time, etc.). Additionally, for example, the electrical box reduces the number of components to purchase and assemble. The electrical box may be used in various applications. By way of example, the electrical box may be used in a food-grade environment and exposed to rinsing, etc.

FIG. 1 is a diagram illustrating an exploded view of an exemplary embodiment of an electrical box 100. As illustrated, electrical box 100 includes an enclosure 105. Enclosure 105 may be made from metal, plastic, or any suitable non-corrosive materials. For example, if electrical box 100 is used in a food service environment, electrical box 100 may be made from stainless steel, polyvinyl chloride (PVC), polycarbonate, nylon 6-6, etc. Other components of electrical box 100 may also be made from metal, plastic, or other suitable material. Enclosure 105 may have a rectangular shape or other suitable configuration (e.g., square, etc.). As described further below, electrical box 100 includes a conduit compartment, a device compartment, and a plug compartment. Enclosure 105 includes hinge portions 106-1 and 106-2 for coupling to an enclosure cover, as described further below.

Figure 2:
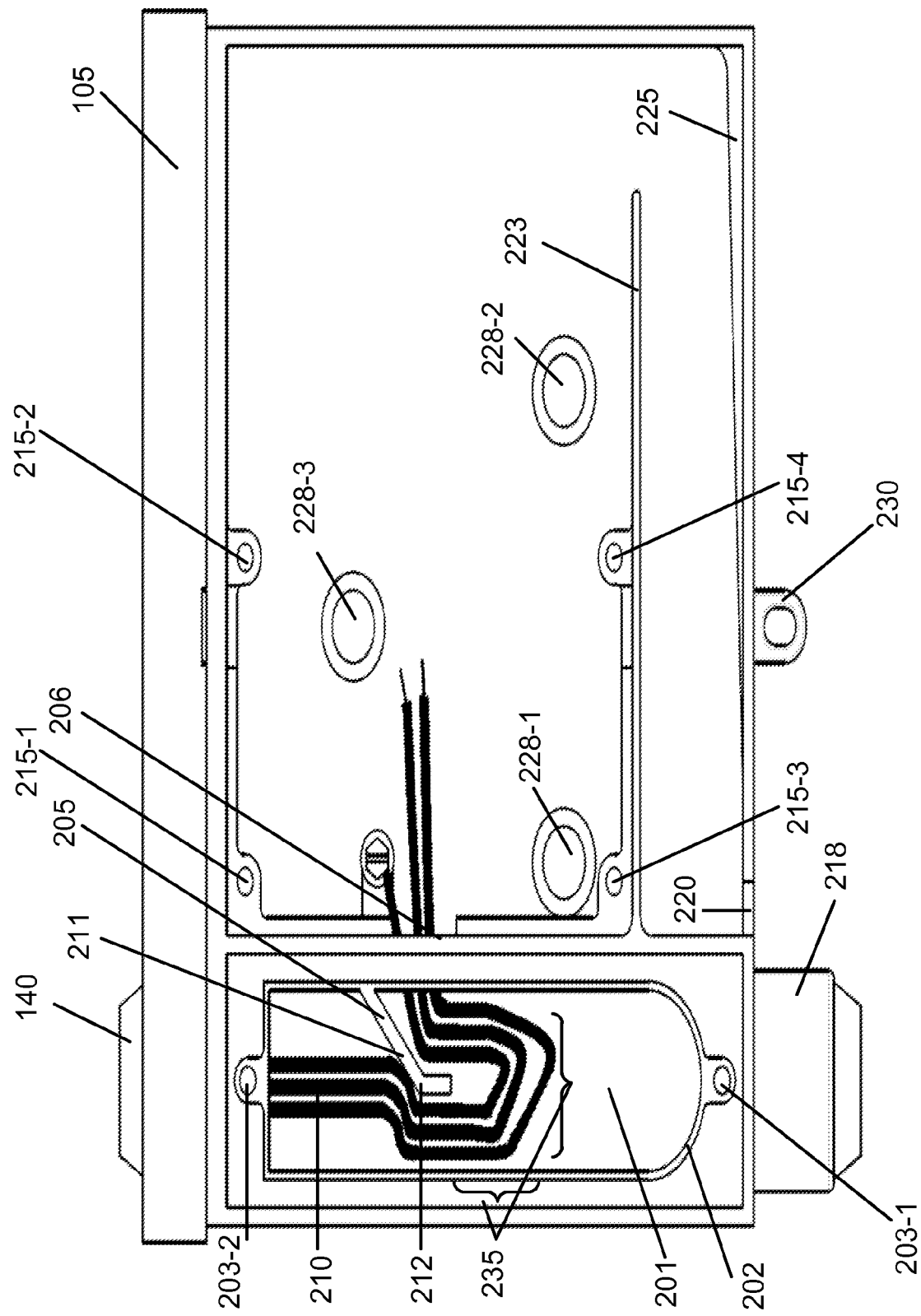
FIG. 2 is a diagram illustrating a front view of an exemplary embodiment of an enclosure.
Figure 3:
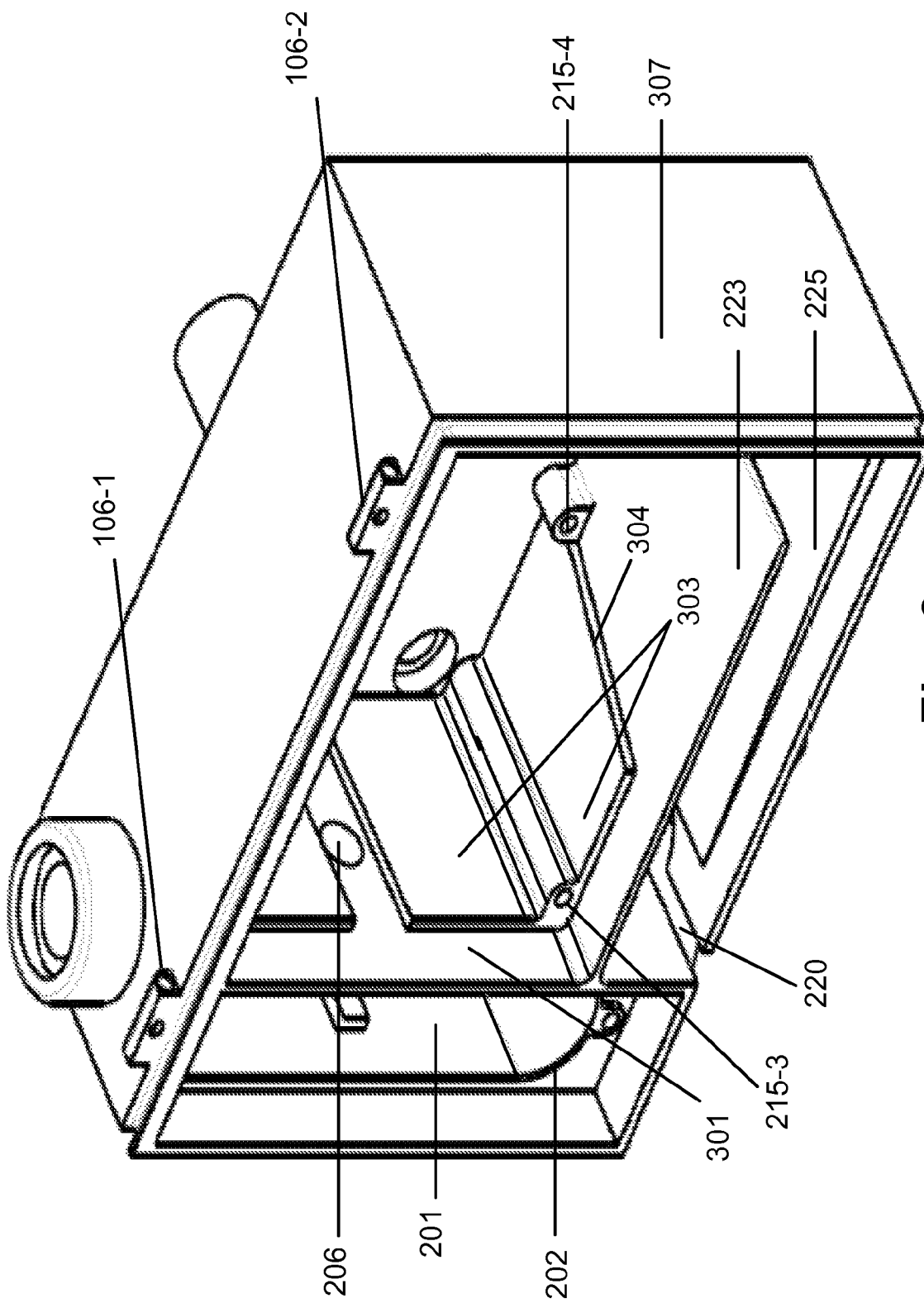
FIG. 3 is a diagram illustrating an isometric view of the enclosure.

Referring to FIG. 2, enclosure 105 includes a conduit compartment 201. As illustrated in FIGS. 2 and 3, conduit compartment 201 includes a U-shaped portion 202. U-shaped portion 202 may facilitate the drainage of liquids from electrical box 105. Referring to FIG. 2, conduit compartment 201 includes holes 203-1 and 203-2 to receive fasteners (e.g., screws, etc.) for securing a conduit cover 107 of conduit compartment 201. Additionally, as illustrated in FIG. 2, conduit compartment 201 includes a conduit guide 205. Conduit guide 205 is described further below.

Referring to FIG. 3, a wall 301 partially defines conduit compartment 201. Wall 301 includes an access hole 206. Access hole 206 provides a passageway from/to conduit compartment 201. For example, as illustrated in FIG. 2, conduits 210 (e.g., wires) may be guided through access hole 206. As further illustrated in FIG. 2, according to an exemplary implementation, conduit guide 205 includes a first guide portion 211 and a second guide portion 212. According to this implementation, second guide portion 212 extends substantially parallel to wall 301. Additionally, second guide portion 212 extends along an imaginary center line that bisects conduit compartment 201. As a result of this configuration, a drip point is created for any installed conduit, such that the drip point is lower than a height of access hole 206. For example, the drip point could be located anywhere in a drip point region 235. In this way, liquid (e.g., water, condensation, etc.) is unable to travel upward along wires 210 and enter the device compartment.

Referring back to FIG. 1, electrical box 100 includes conduit cover 107 and a conduit compartment gasket 109. Fasteners 111-1 and 111-2 may be used to attach conduit cover 107 and conduit compartment gasket 109 to enclosure 105 using holes 203-1 and 203-2.

Figure 4:
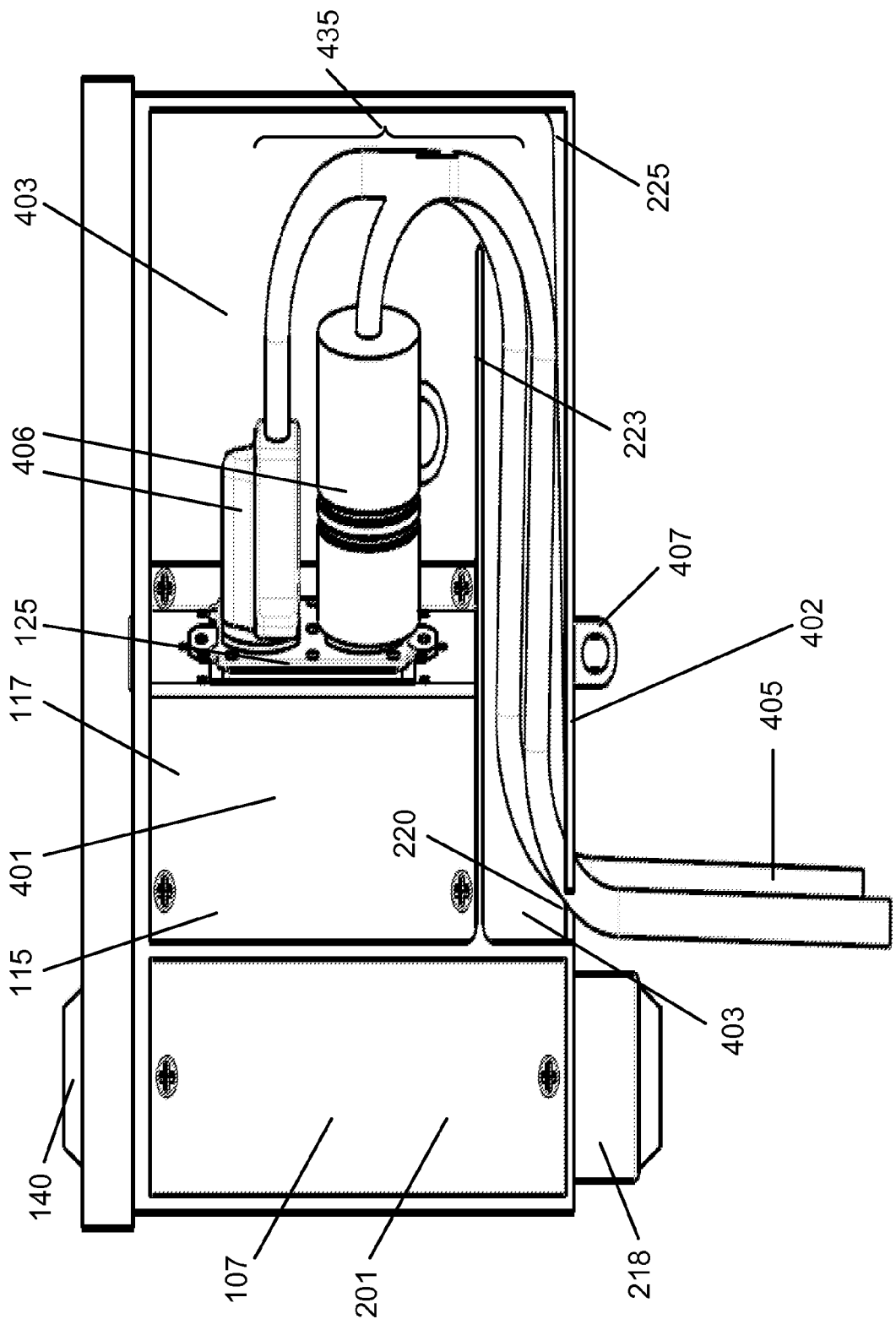
FIG. 4 is a diagram illustrating a front view of the enclosure.

Electrical box 100 includes a device compartment plate 115. Device compartment plate 115 includes a device cover portion 117, a receptacle portion 119 that includes a hole 121, and an enclosure attachment portion 123. Device cover portion 117 extends substantially parallel to enclosure attachment portion 123. Fasteners 122-1 through 122-4 may be used to attach device compartment plate 115 to enclosure 105. As illustrated in FIG. 2, enclosure 105 includes fastener holes 215-1 through 215-4 to receive fasteners 122-1 through 122-4. FIG. 4 illustrates device compartment plate 115 attached to enclosure 105.

Referring to FIG. 3, enclosure 105 includes a device compartment plate portion 303. According to an exemplary implementation, device compartment plate portion 303 has an L-shape configuration. Additionally, device compartment plate portion 303 includes an angled edge 304. Referring to FIG. 4, when device compartment plate 115 is assembled to enclosure 105, a device compartment 401 is formed. For example, device compartment plate 115 may be aligned with the edges of device compartment plate portion 303 and angled edge 304. As further illustrated, device compartment 401 may be used to house a receptacle 125 (as illustrated in FIG. 1) or other device. Receptacle portion 119 of device compartment plate 115 can be positioned along angled edge 304. Receptacle 125 is oriented at an angle, in accordance with receptacle portion 119 and angled edge 304, to facilitate an insertion of a plug into receptacle 125 by a user. FIG. 4 is described further below.

Referring back to FIG. 1, electrical box 100 includes an outlet adaptor 127 to fit over and expose receptacle 125. Fasteners 128-1 and 128-2 may be used to assemble receptacle 125 and outlet adaptor 127 to receptacle portion 119 of device compartment plate 115.

As further illustrated in FIG. 1, electrical box 100 includes an electrical box gasket 130 and an electrical box cover 132. Electrical box cover 132 includes a fastener hole 133 and hinge portions 134-1 and 134-2. Fasteners 137-1 and 137-2 may be used to assemble hinge portions 134-1 and 134-2 of electrical box cover 132 with hinge portions 106-1 and 106-2 of enclosure 105. Electrical box 105 also includes a conduit receiver 140 and gaskets 142 and 143.

Figure 8:
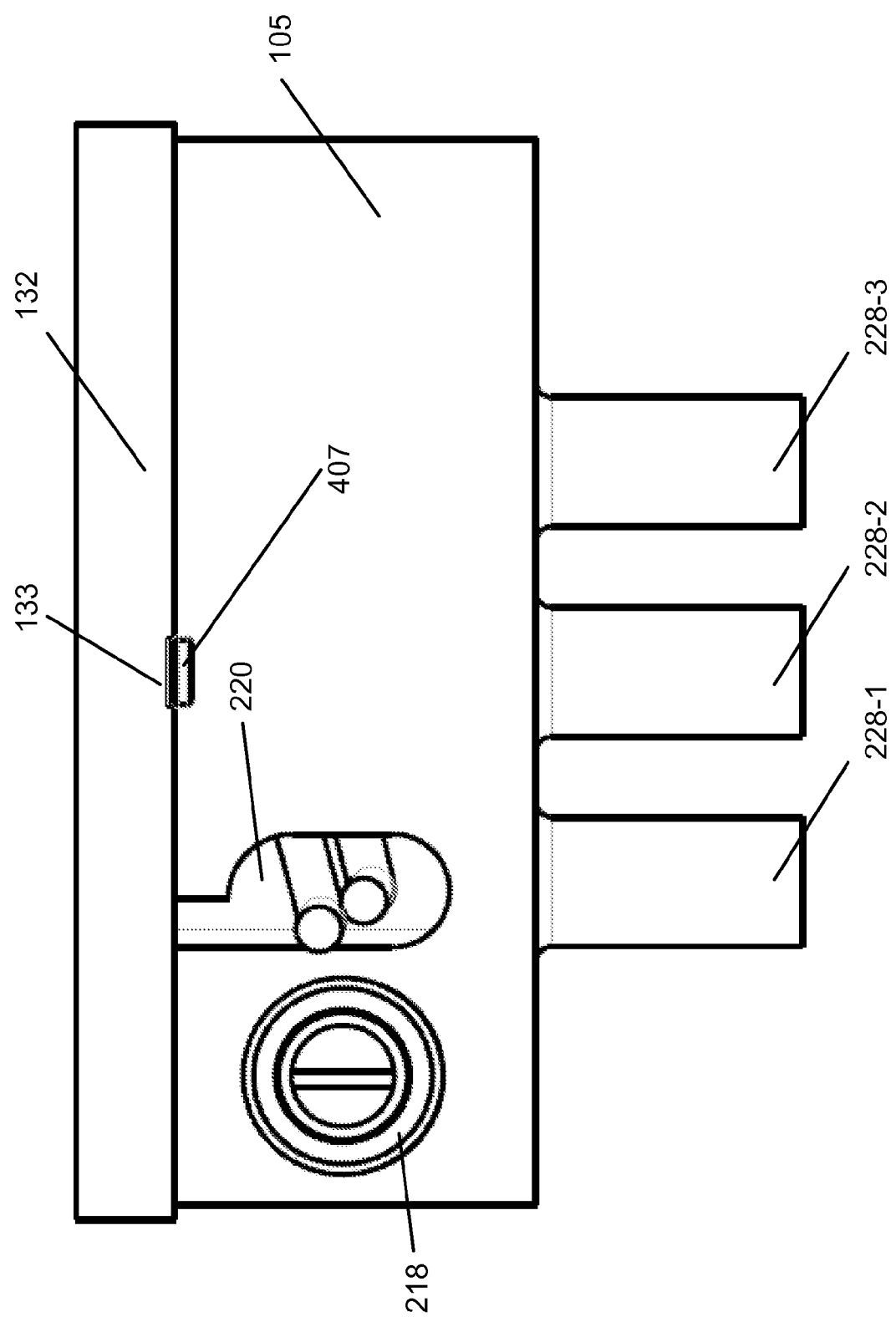
FIG. 8 is a diagram illustrating a bottom view of the electrical box in the closed configuration.

Referring to FIG. 2, electrical box 100 includes a drain portion 218. Drain portion 218 allows liquid to exit electrical box 100. FIG. 8 is a diagram illustrating a bottom view of electrical box 100. Gasket 143 may be inserted into drain portion 218. A valve with a handle (not illustrated) may be connected to drain portion 218 and gasket 143. For example, the valve may be a ball value for (manually) controlling the flow or release of water or liquid accumulating within electrical box 100. According to another exemplary implementation, a pilot valve or other automated valve may be attached, or a conduit or a pipe may be attached to allow water or a liquid to flow from electrical box 100.

Referring to FIG. 2, enclosure 105 includes a conduit hole 220. FIGS. 3 and 8 illustrate other views of conduit hole 220. As illustrated in FIG. 4, a conduit 405 (e.g., an electrical cable coupled to a plug or other terminal) may be fed into enclosure 105 via conduit hole 220 while enclosure 105 is in an open configuration. Referring to FIGS. 1-4, according to an exemplary implementation, conduit hole 220 is located adjacent to conduit compartment 201 and substantially vertically aligned with access hole 206.

Referring back to FIG. 2, enclosure 105 includes a conduit guide wall 223 and a sloped portion 225. FIG. 3 also illustrates another view of conduit guide wall 223 and sloped portion 225. As illustrated in FIG. 3, sloped portion 225 extends from conduit hole 220 to a side surface 307 of enclosure 105. Referring to FIG. 4, based on conduit guide wall 223, a drip point is created with respect to an installed conduit 405 that prevents liquid from reaching receptacle 125. For example, the drip point could be located anywhere in a drip point region 435. For example, assuming water was to enter electrical box 100 via conduit hole 220, the water may not be able to travel upward along conduit 405 to reach receptacle 125 located above conduit guide wall 223, based on the drip point. Additionally, sloped portion 225 facilitates the water to travel and exit electrical box 100 via conduit hole 220.

As illustrated, according to an exemplary implementation, conduit guide wall 223 extends substantially parallel to a bottom surface 402 of enclosure 105. The passageway partially defined by bottom surface 402 of enclosure 105 and conduit guide wall 223, and the area provided for conduit 405 and the male plugs 406 correspond to a plug compartment 403. For purposes of description, as illustrated in FIG. 4, electrical box 100 includes conduit compartment 201, device compartment 401, and plug compartment 403.

Figure 5:
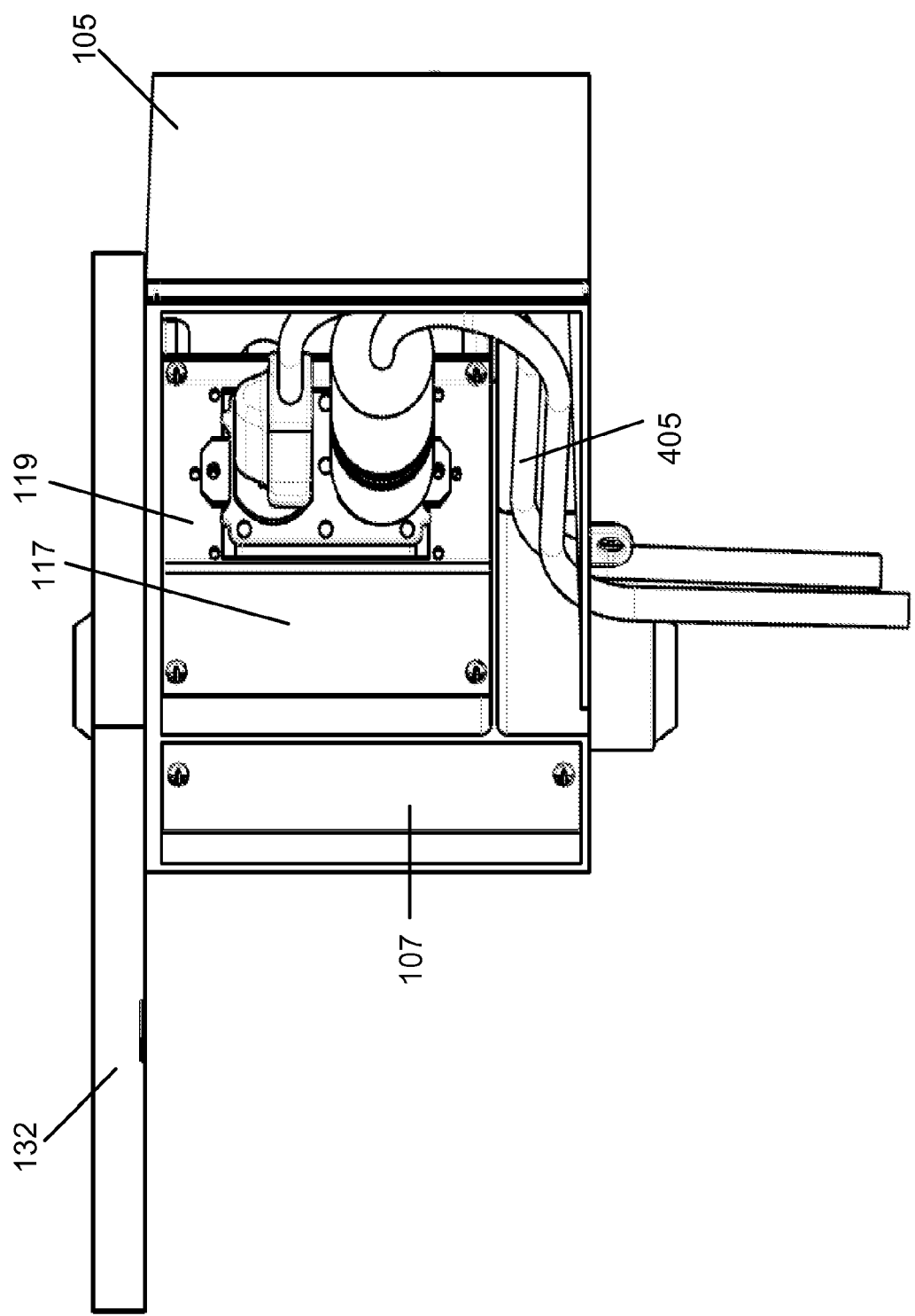
FIG. 5 is a diagram illustrating an isometric view of the electrical box in an open configuration.

As further illustrated in FIG. 4, enclosure 105 includes a cover fastener hole 407. Referring to FIG. 1, a fastener 139 may be used to affix fastener hole 133 of electrical box cover 132 to cover fastener hole 407 of enclosure 105. FIG. 5 is a diagram illustrating an isometric view of electrical box 100. As illustrated, cover 132 is in an open position.

Figure 6:
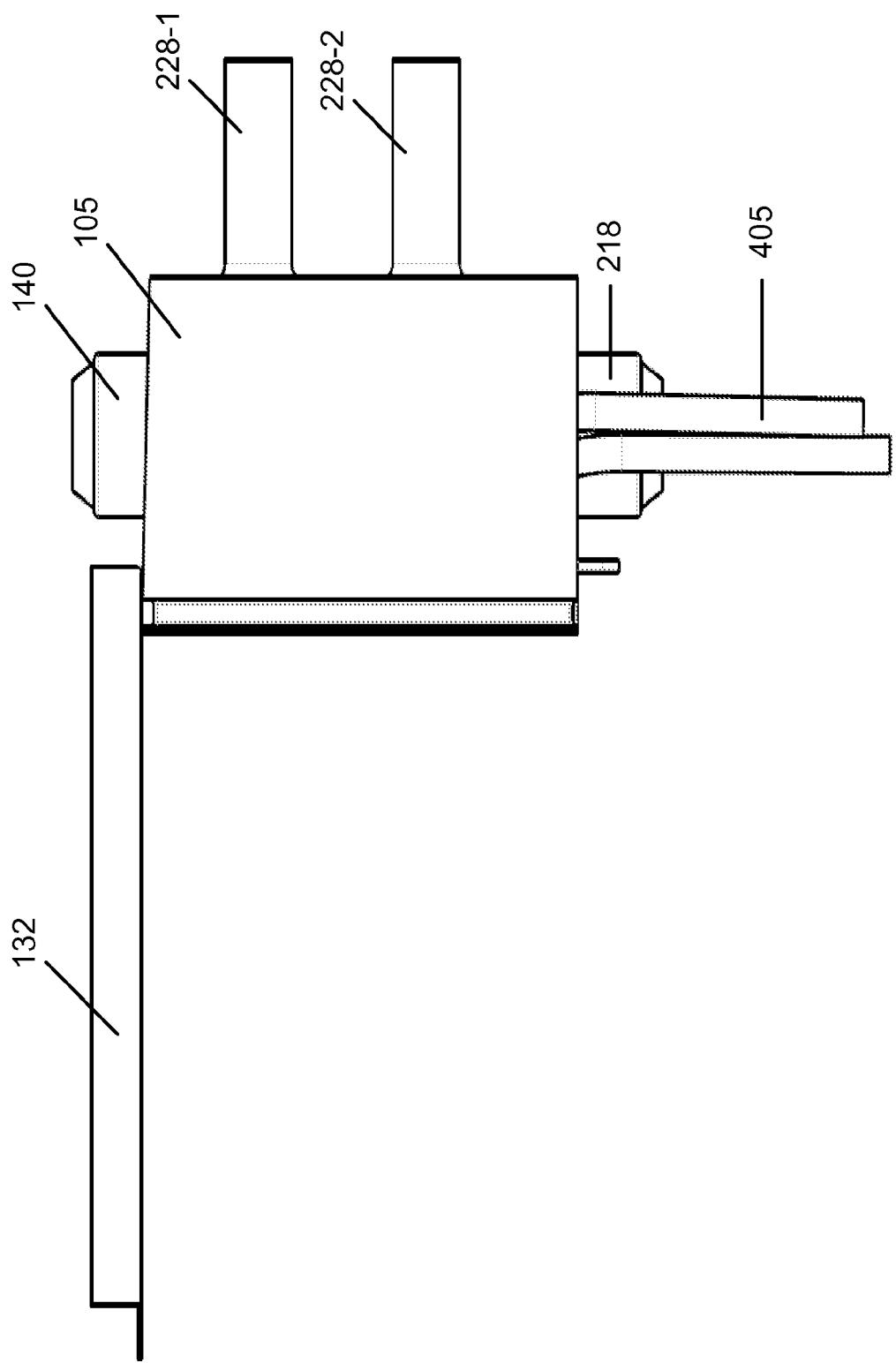
FIG. 6 is a diagram illustrating a side view of the electrical box in the open configuration.

FIG. 6 is a diagram illustrating a side view of electrical box 100. As illustrated, cover 132 is in an open position. Additionally, electrical box 100 may be mounted on a surface using standoffs. For example, as illustrated in FIG. 6, standoffs 228-1 and 228-2 may be used, which are also illustrated in FIG. 2. According to an exemplary implementation, standoffs 228 may be integral with electrical box 100. Alternatively, standoffs 228 may be user-positioned and attached to electrical box 100.

Figure 7:
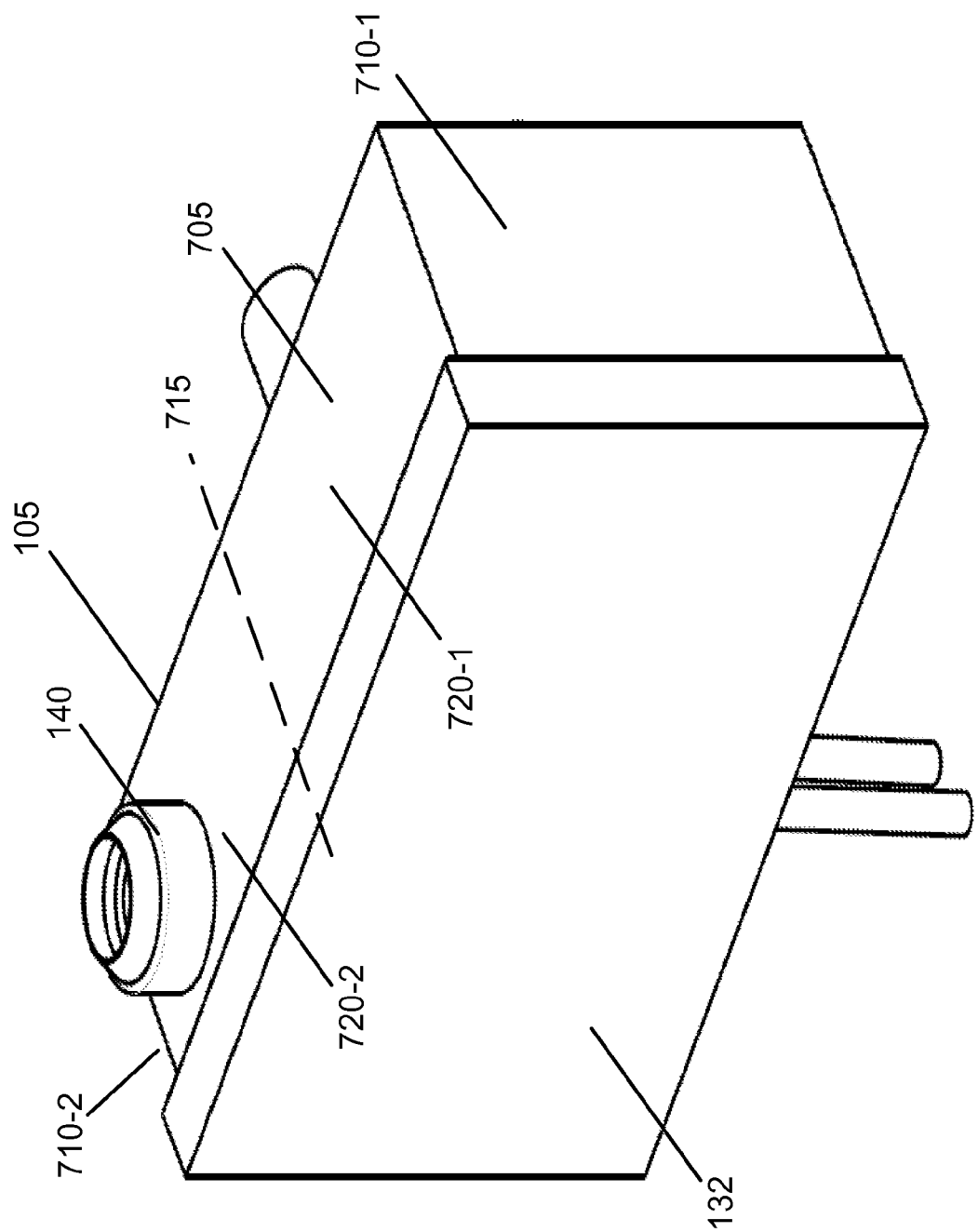
FIG. 7 is a diagram illustrating another isometric view of the electrical box in a closed configuration.

FIG. 7 is a diagram illustrating an isometric view of electrical box 100. As illustrated, cover 132 is in a closed position. According to an exemplary embodiment, top wall 705 of enclosure 105 has an inverted-V configuration to permit liquid, contaminants, etc., run-off, which may prevent liquid accumulation, etc., on top of electrical box 100. For example, at a mid-point 715 (or substantial midpoint), top wall 705 includes a downward slope portion 720-1 and 720-2. This is in contrast to existing electrical box configurations in which the top portion is horizontal and has a slope of zero. FIG. 8 is a diagram illustrating a bottom view of electrical box 100.

Figure 9:
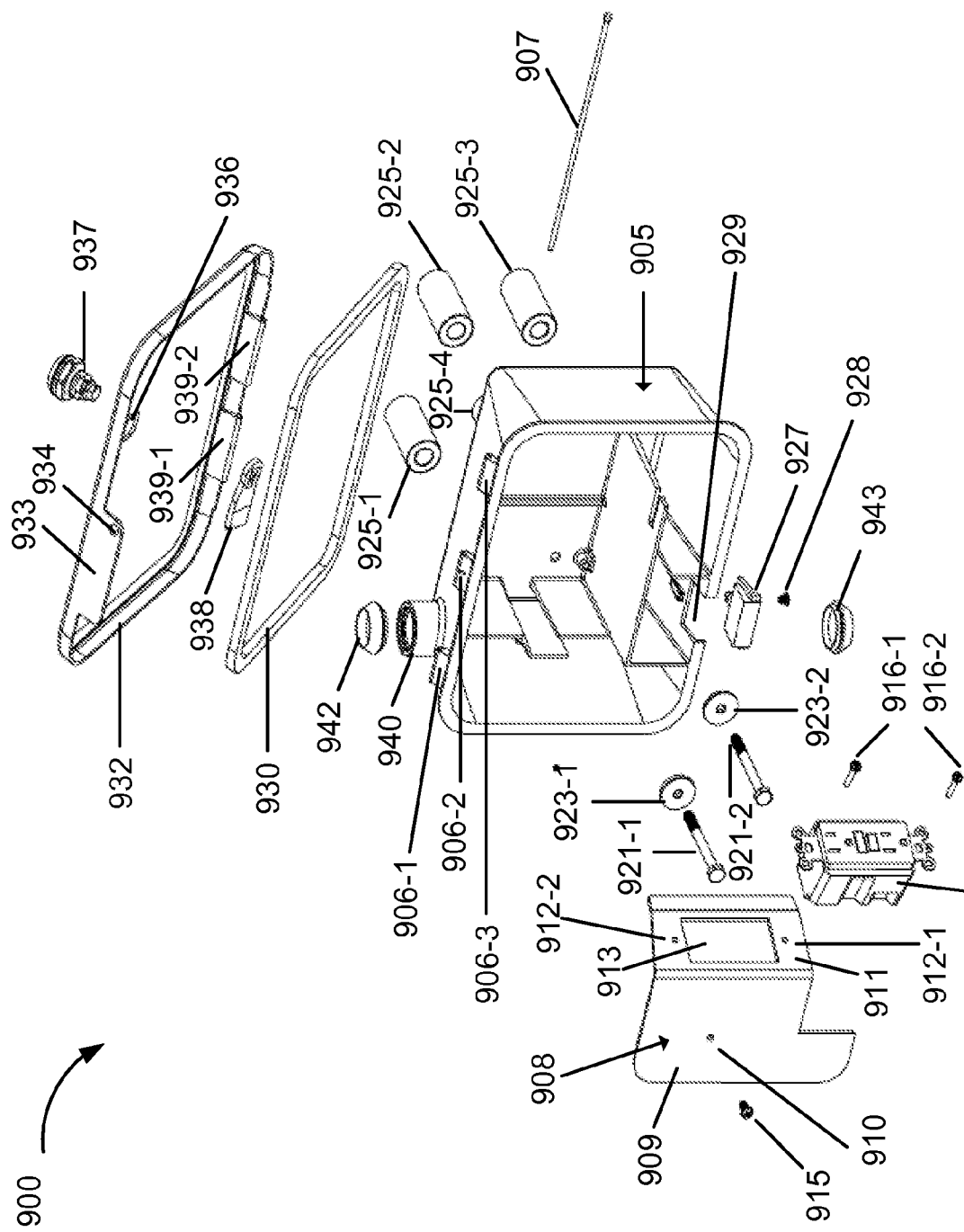
FIG. 9 is a diagram illustrating an exploded view of another exemplary embodiment of an electrical box.

FIG. 9 is a diagram illustrating an exploded view of an exemplary embodiment of an electrical box 900. As illustrated, electrical box 900 includes an enclosure 905. Enclosure 905 may be made from metal, plastic, or any suitable non-corrosive materials. For example, if electrical box 900 is used in a food service environment, electrical box 900 may be made from stainless steel, polyvinyl chloride (PVC), polycarbonate, nylon 6-6, etc. Other components of electrical box 900 may also be made from metal, plastic, or other suitable material. Enclosure 905 may have a rectangular shape, a rounded rectangular shape or other suitable configuration (e.g., square, etc.). Enclosure 905 includes hinge portions 906-1, 906-2, and 906-3 for coupling to an enclosure cover, as described further below. Additionally, electrical box 900 includes a hinge rod 907.

In contrast to electrical box 100, which includes conduit cover 107 and a device compartment plate 115, electrical box 900 includes a cover plate 908. As described further below and illustrated, cover plate 908 covers a conduit compartment and a device compartment of enclosure 905. Cover plate 908 includes a face plate 909 that has a shape that matches an opening defined by enclosure 905. Cover plate 908 also includes a side plate 911. Face plate 909 and side plate 911 extend at an angle similar to device cover portion 117 and receptacle portion 119. Face plate 909 includes a hole 910 to receive a fastener 915, which can be used to attach cover plate 908 to enclosure 905. Additionally, side plate 911 includes a hole 913 to receive a receptacle 919. Side plate 911 includes holes 912-1 and 912-2 to receive fasteners 916-1 and 916-2 to attach receptacle 919 to cover plate 908.

Fasteners 921-1 and 921-2 (e.g., bolts) (also referred to herein as fasteners 921) and washers 923-1 and 923-2 (also referred to herein as washers 923) can be used to attach enclosure 905 to a surface (e.g., a wall). Additionally, fasteners 921 and washers 923 can be used to attach enclosure 905 to a surface using standoffs 925-1, 925-2, 925-3, and 925-4 (also referred to herein as standoffs 925). Washers 923 may be made from metal bonded to rubber in order to act as a seal. Standoffs 925 may be separate, in contrast to integrally-formed, components of electrical box 900.

As further illustrated in FIG. 9, electrical box 900 includes a plug 927 that is attachable to enclosure 905 with a fastener 928. For example, plug 927 may fit within a cutout portion 929 of enclosure 905. According to an exemplary implementation, plug 927 can swivel at least 180 degrees. For example, as illustrated and described further below, when a user wishes to feed a chord with a plug into enclosure 905 via cutout portion 929, plug 927 can swivel to expose cutout portion 929. Otherwise, during a time when the chord and the plug is not being used, the user can fill cutout portion 929 with plug 927. In this way, plug 927 may prevent debris and other containments (e.g., water, etc.) from entering enclosure 905. According to an exemplary implementation, plug 927 may be made from a silicon-based material or other suitable material. Plug 927 may also allow enclosure 905 to be rated with a 4× declaration for washdown.

As further illustrated in FIG. 9, electrical box 900 includes an electrical box gasket 930 and an electrical box cover 932. Electrical box cover 932 includes a lip portion 933 that extends outwardly. Lip portion 933 includes a hole 934. As described and illustrated further below, hole 934 may mate with another hole of enclosure 905 to allow a user to, for example, place a padlock through hole 934 for securing electrical box 900. Additionally, electrical box cover 932 includes a hole 936 to receive a latch fastener 937 associated with a latch 938. Electrical box cover 932 includes hinge portions 939-1 and 939-2, which in conjunction with hinge portions 906-1 and 906-2, as well as hinge rod 907, form a hinge mechanism. Electrical box 900 also includes a conduit receiver 940, a gasket 942, and a gasket 943.

Figure 10:
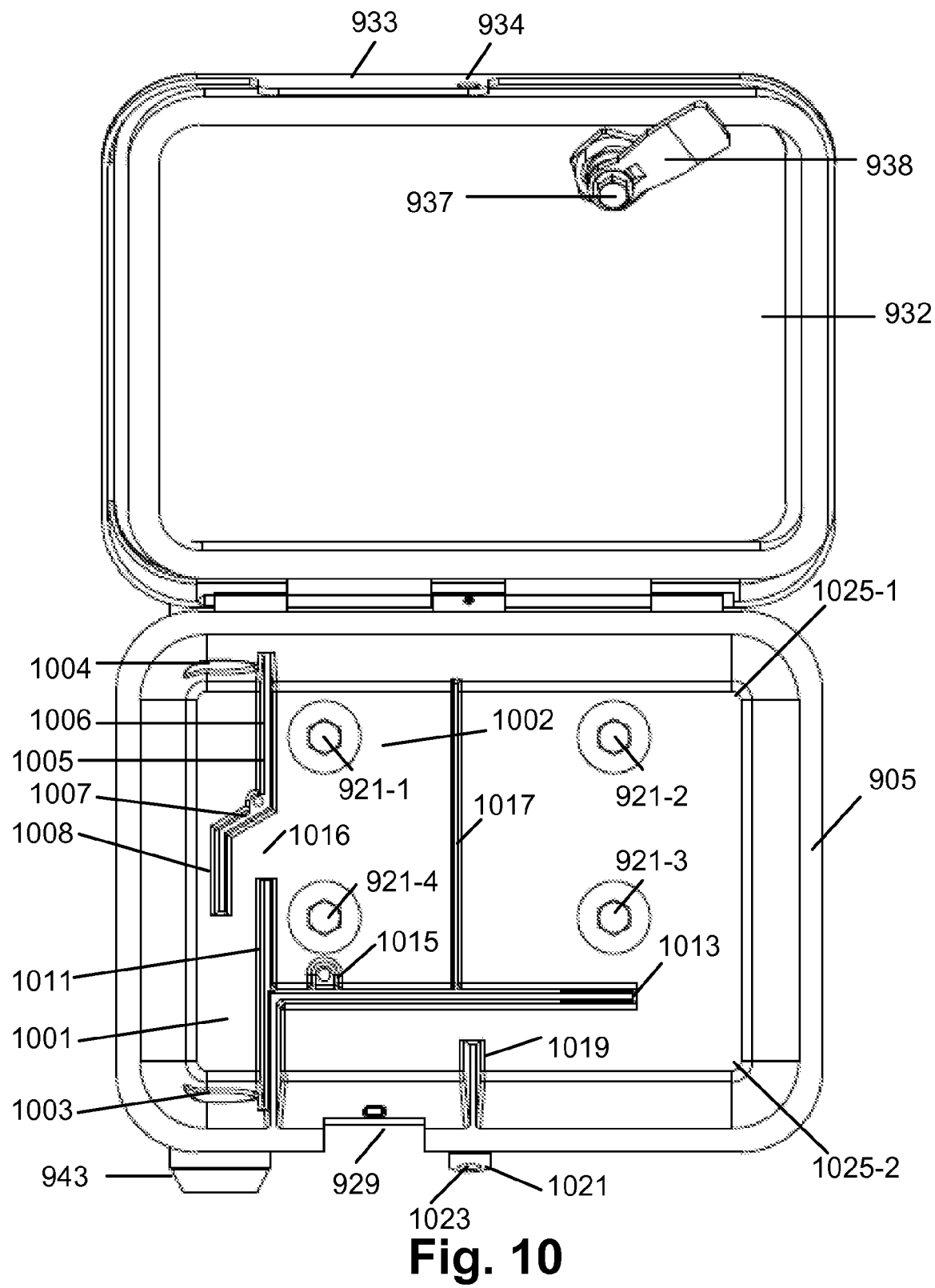
FIG. 10 is a diagram illustrating a front view of an exemplary embodiment of the electrical box in an open configuration.
Figure 11:
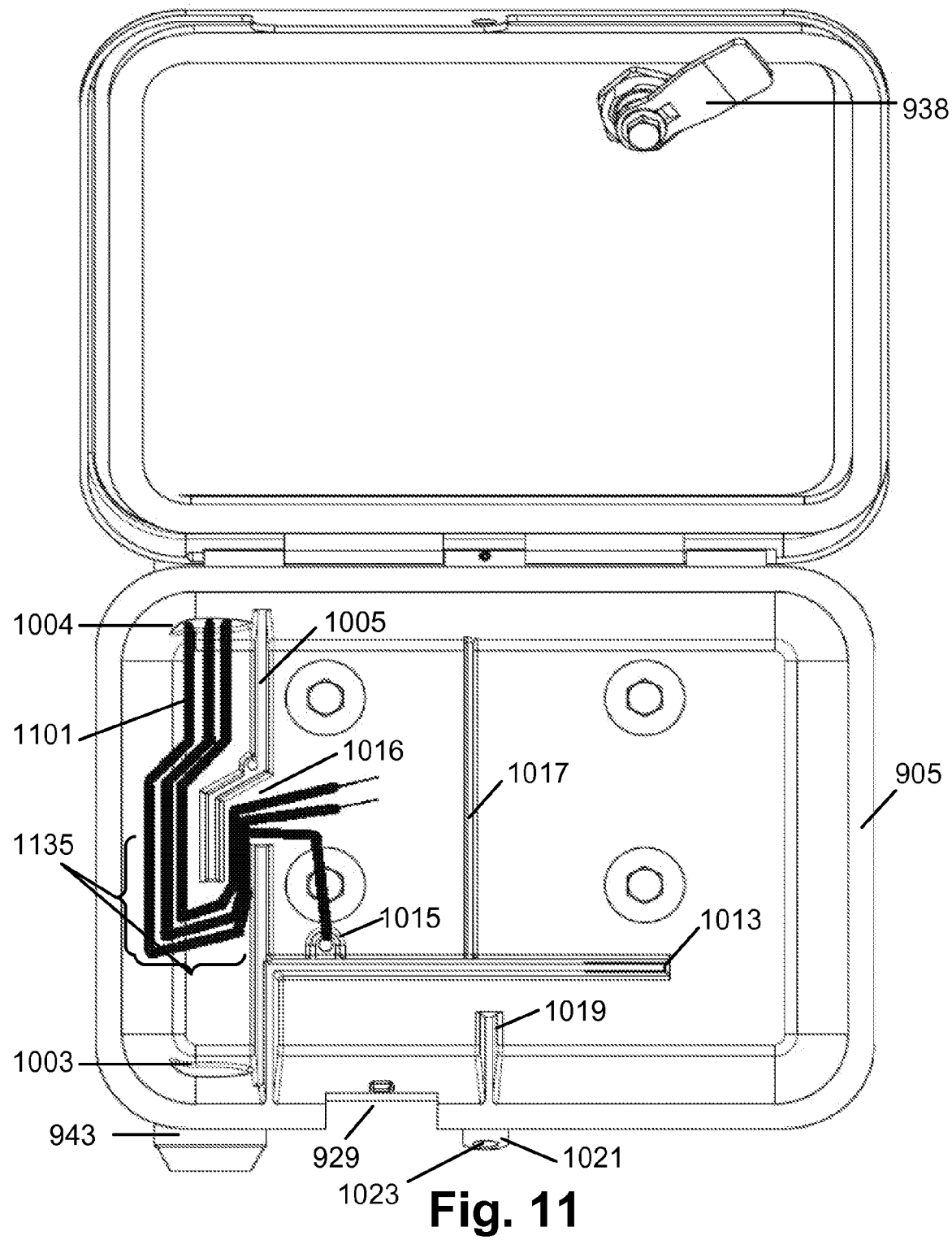
FIG. 11 is a diagram illustrating another front view of the electrical box with wires in an open configuration.
Figure 12:
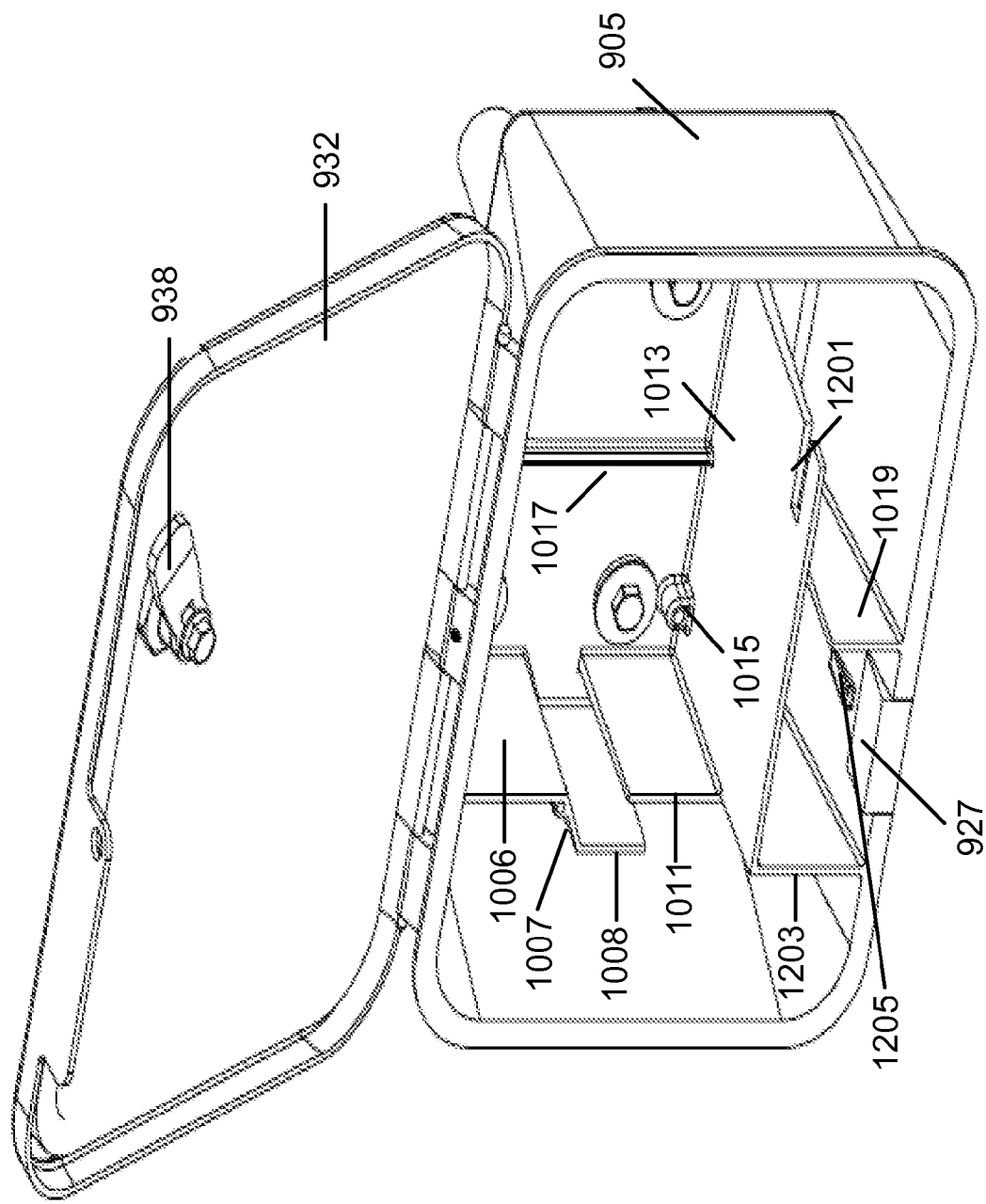
FIG. 12 is a diagram illustrating an isometric view of the electrical box in an open configuration.

FIG. 10 is a diagram illustrating a front view of an exemplary embodiment of the electrical box in an open configuration. FIG. 11 is a diagram illustrating another front view of the electrical box with wires in an open configuration. FIG. 12 is a diagram illustrating an isometric view of the electrical box in an open configuration.

As illustrated, for example, in FIG. 10, enclosure 905 includes a conduit compartment 1001 and a device compartment 1002. Enclosure 905 includes access holes 1003 and 1004. Conduit compartment 1001 and device compartment 1002 are partially defined by a conduit guide 1005 that includes a first guide portion 1006, a second guide portion 1007, and a third guide portion 1008. According to an exemplary implementation, first guide portion 1006 and third guide portion 1008 extend substantially parallel to a side wall of enclosure 905. Also, second guide portion 1007 extends in a sloped manner. Conduit compartment 1001 and device compartment 1002 are also partially defined by a conduit guide 1011.

As further illustrated in FIG. 10, enclosure 905 includes a conduit guide 1011 and a conduit guide 1013. Conduit guide 1011 extends parallel to third guide portion 1008 and extends on a same plane as first guide portion 1006. Conduit guide 1013 extends perpendicular from conduit guide 1011. Conduit guide 1013 includes a grounder 1015. Grounder 1015 can be used as a ground. As a result of this configuration, a drip point is created for any installed conduit, such that the drip point is lower than a height of an access gap 1016. For example, conduit guide 1005 and conduit guide 111 shapes a wire in such a way that water will adhere to the wire, flow downward and then drip off at the lowest point. In this way, the water may stop from migrating to the electrical device via surface tension/adhesion and may cause the water to drip off the wire and to the bottom exit conduit entry.

Additionally, as illustrated, enclosure 905 includes a divider 1017 and a conduit guide 1019. Divider 1017 seals any meeting gap that may exist between cover plate 908 and back wall of enclosure 905, when cover plate 908 is assembled to enclosure 905. Additionally, divider 1017 may serve as a location point, to a user, when assembling cover plate 908 with enclosure 905. Divider 1017 extends parallel to first guide portion 1006 and conduit guide 1011. A portion of conduit guide 1013 intersects with divider 1017 and extends perpendicular to divider 1017.

Enclosure 905 further includes a tab 1021 that includes a hole 1023. As described further below and illustrated in FIG. 15, when electrical box cover 932 is closed, hole 934 of lip portion 933 and hole 1023 align. In this way, a user may insert, for example, a pad lock through holes 934 and 1023. According to an exemplary embodiment, enclosure 905 has rounded corners 1205-1 and 1205-2, as well as elsewhere, so as to facilitate water or other debris to travel and exit electrical box 900.

Referring to FIG. 11, a user may guide wires 1101 via access hole 1004 and around conduit guide 1005, which creates a drip point that is lower in height relative to access gap 1016. For example, the drip point could be located anywhere in a drip point region 1135. Referring to FIG. 12, conduit guide 1013 includes a notched portion 1201 that is configured to receive latch 938 when electrical box cover 932 is in a closed portion. Additionally, conduit guide 1013 is partially supported by a guide portion 1203. Enclosure 905 also includes a molded portion 1205 to receive fastener 928 of plug 927.

Figure 13:
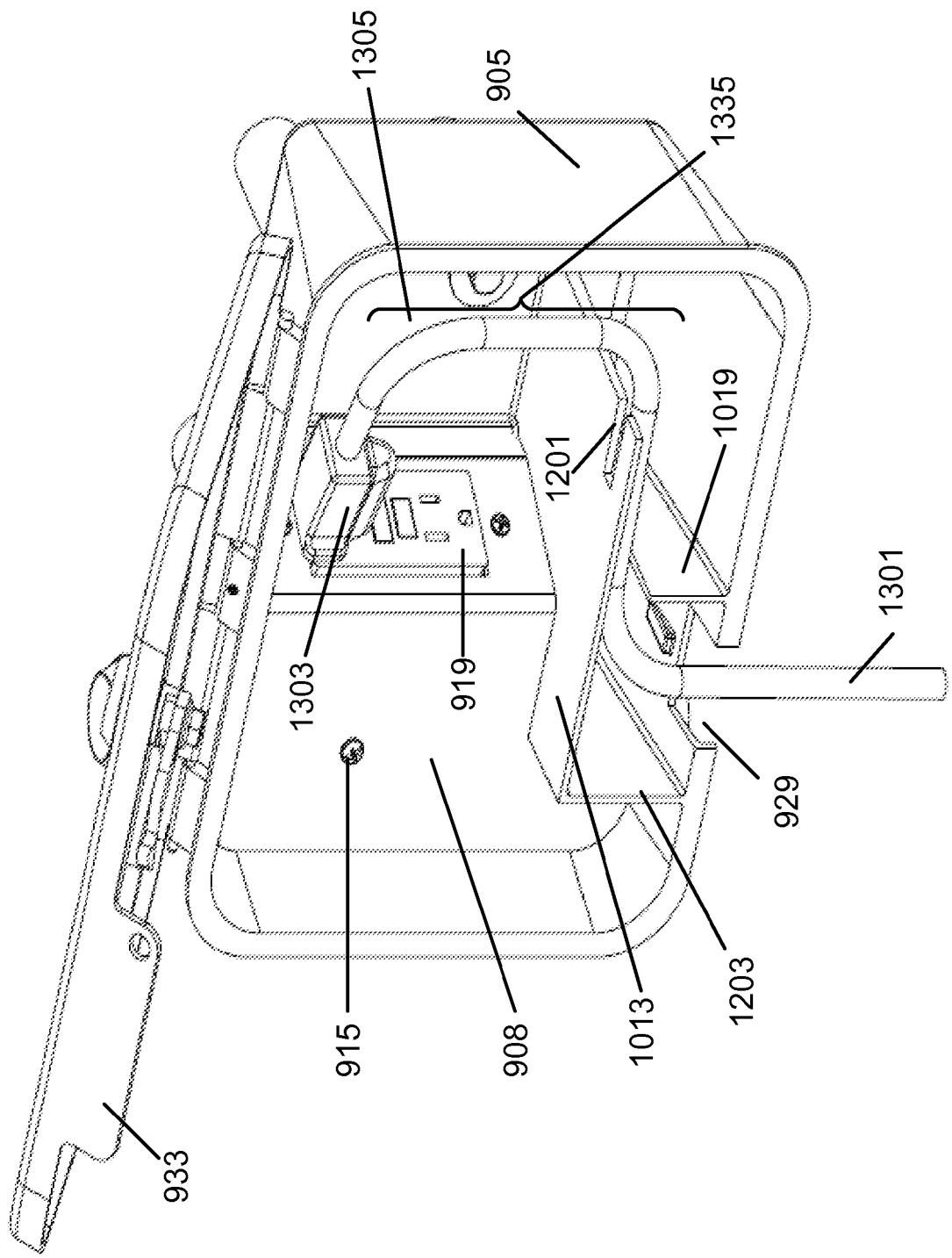
FIG. 13 is a diagram illustrating another isometric view of the electrical box with an electrical cord in an open configuration.

FIG. 13 is a diagram illustrating another isometric view of the electrical box with an electrical plug in an open configuration. As illustrated, an electrical cord 1301 having an electrical plug 1303 may be fed through cutout portion 929 and over conduit guide 1019. Conduit guide 1019 may provide support for electrical cord 1301. Conduit guide 1019 may also act as a wall to prevent debris from entering enclosure 905. As further illustrated, electrical cord 1301 may be further fed around conduit guide 1013. Electrical plug 1303 may be plugged into receptacle 919. Based on conduit guide 1013, a drip point is created with respect to installed electrical cord 1301, which prevents liquid from reaching receptacle 919. For example, the drip point could be located anywhere in a drip point region 1335. For example, even if some water or condensation resided on electrical cord 1301 and bypassed conduit guide 1019, the water or the condensation would not be able to travel upward along electrical cord 1301 to reach receptacle 919.

Figure 14:
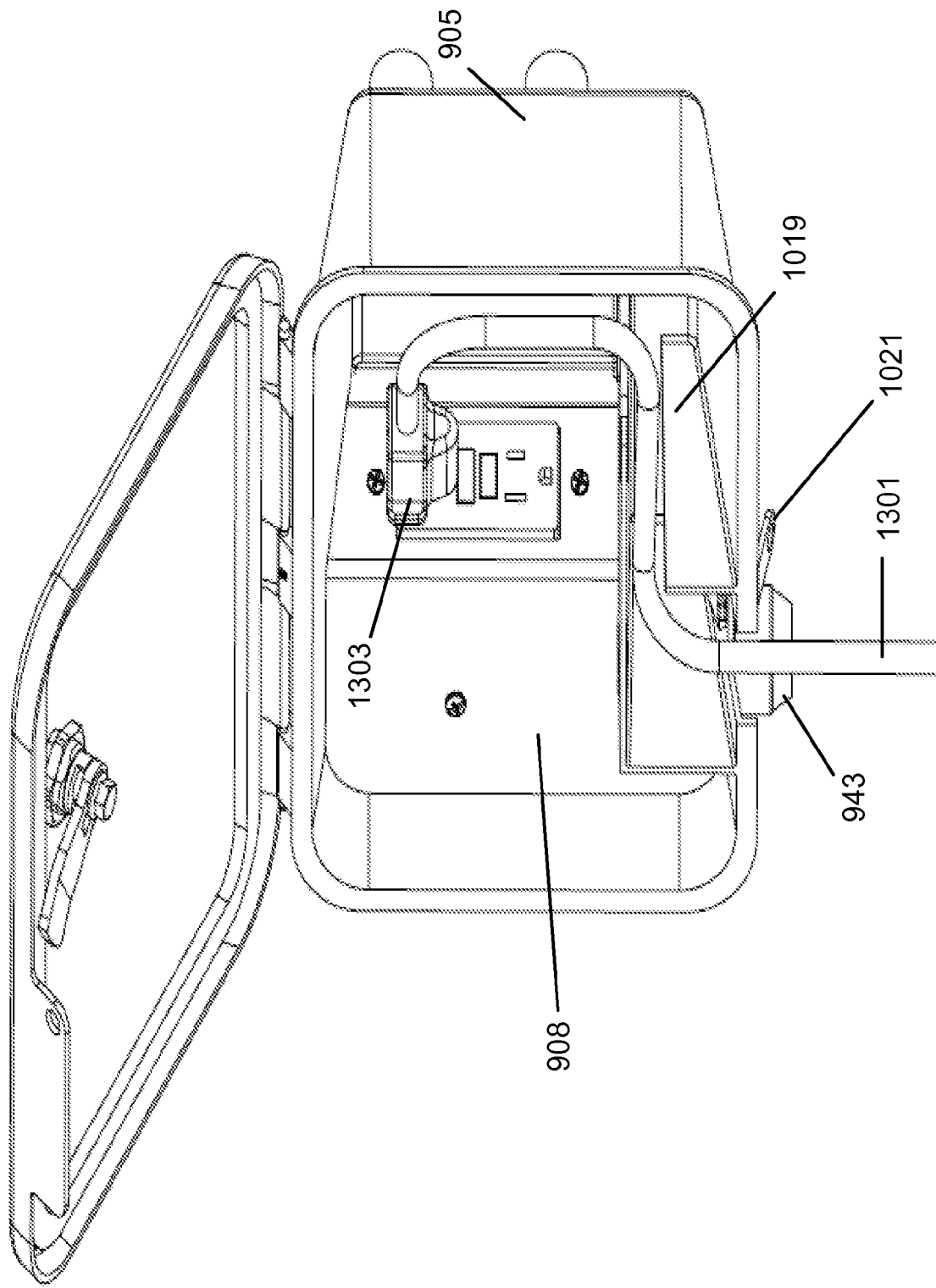
FIG. 14 is a diagram illustrating yet another isometric view of the electrical box with an electrical cord in an open configuration.

According to an exemplary implementation, notched portion 1201 may have a dimension such that electrical cord 1301 is unable to be pinched by notched portion 1201. For example, notched portion 1201 may be sufficiently narrow in dimension to prevent this occurrence. As further illustrated, cover plate 908 is assembled to enclosure 905 with fastener 915. When assembled, cover plate 908 provides a cover to conduit compartment 1001 and device compartment 1002. Additionally, analogous to electrical box 100, a plug compartment 1305 may be formed based on the assembly of cover plate 908. FIG. 14 is a diagram illustrating yet another isometric view of electrical box 900 with electrical cord 1301 in an open configuration.

Figure 15:
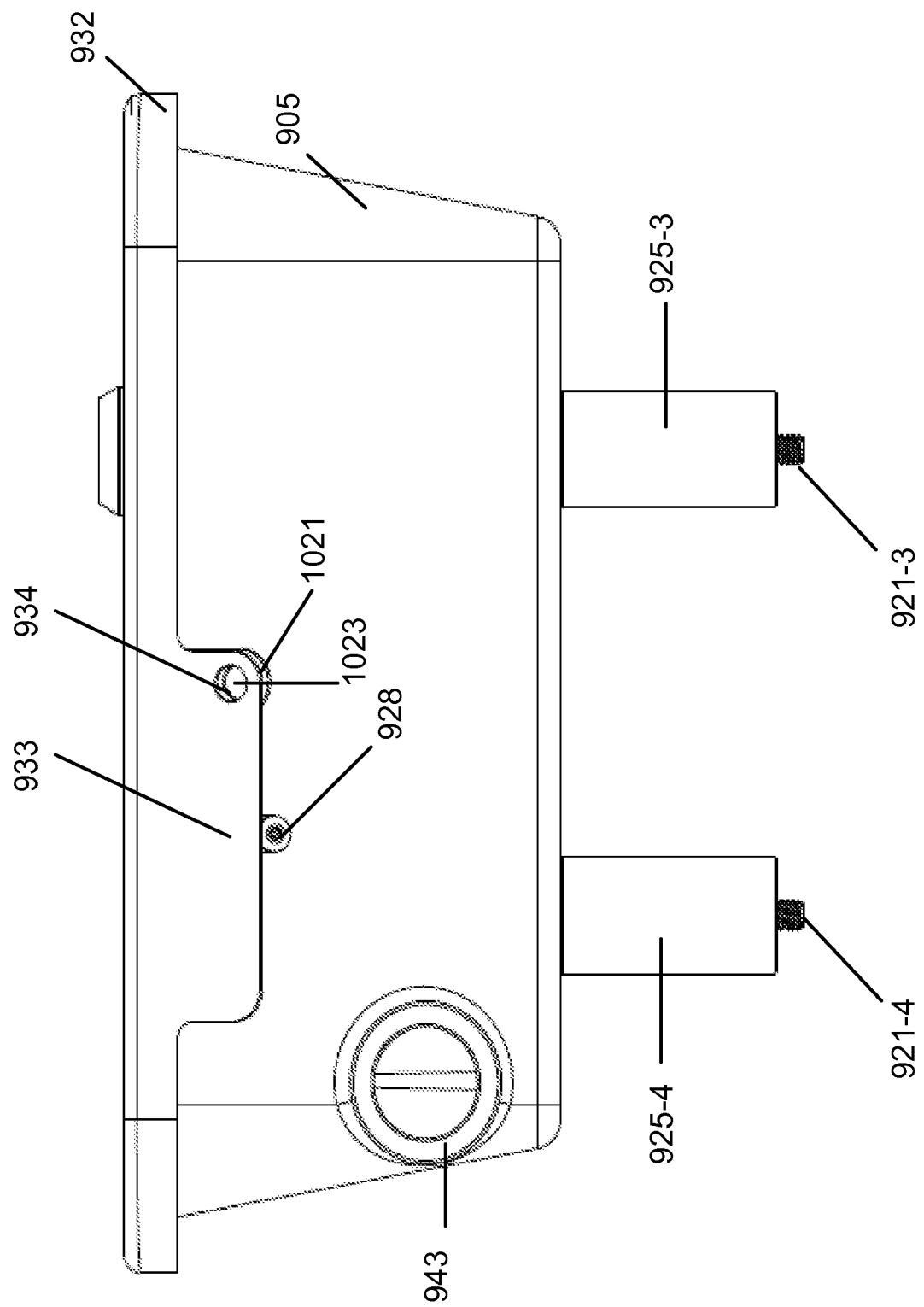
FIG. 15 is a diagram illustrating a bottom-side view of the electrical box in a closed configuration.

FIG. 15 is a diagram illustrating a bottom-side view of the electrical box 900. As previously described, FIG. 15 illustrates, among other things, that when electrical box cover 932 is closed, hole 934 of lip portion 933 and hole 1023 of tab 1021 align. In this way, a user may insert, for example, a pad lock through holes 934 and 1023. Additionally, as previously described, standoffs 925 are separate components (versus integral), which may be placed according to the user's discretion.

Figure 16:
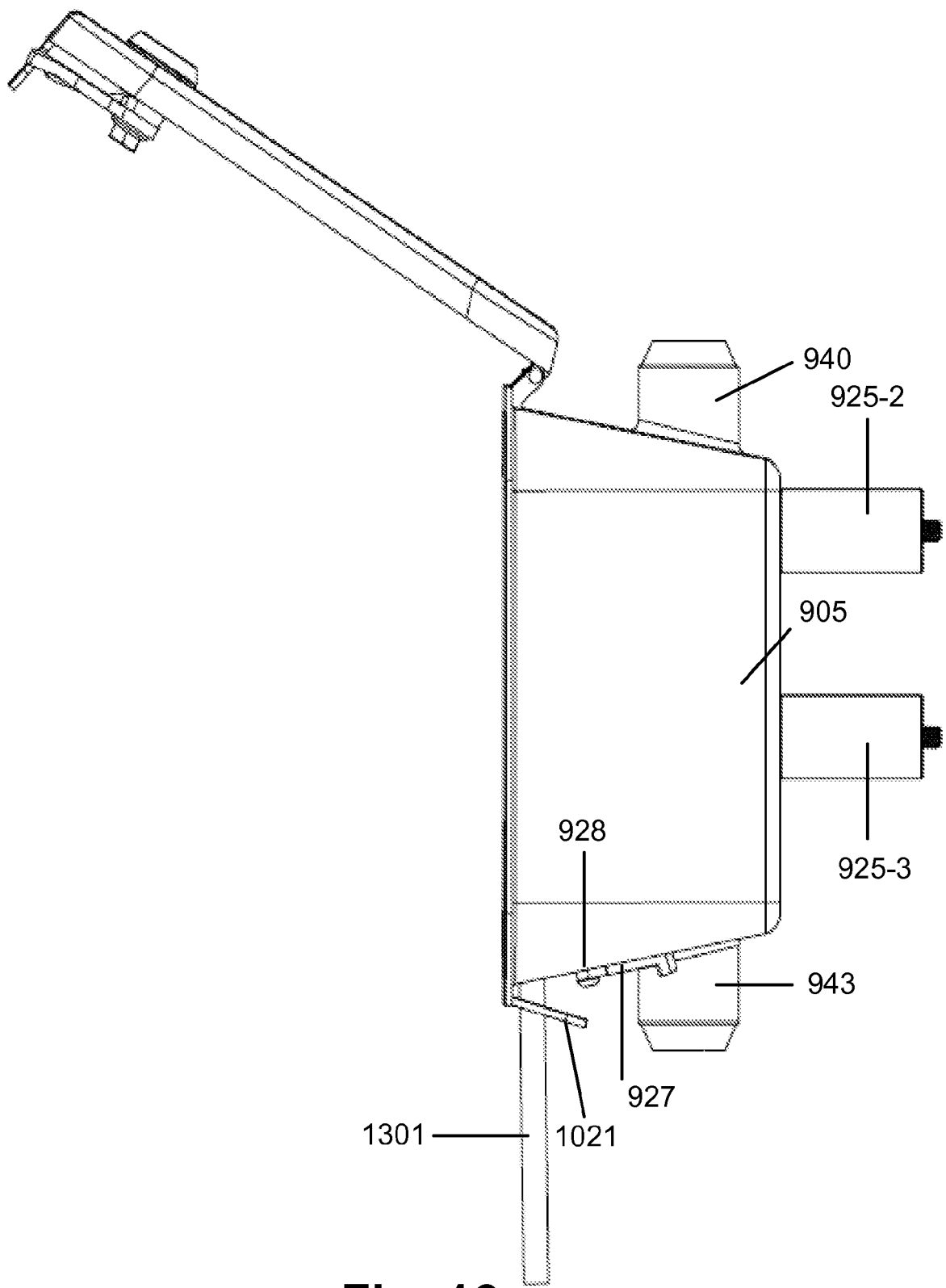
FIG. 16 is a diagram illustrating a side view of the electrical box in an open configuration.
Figure 17:
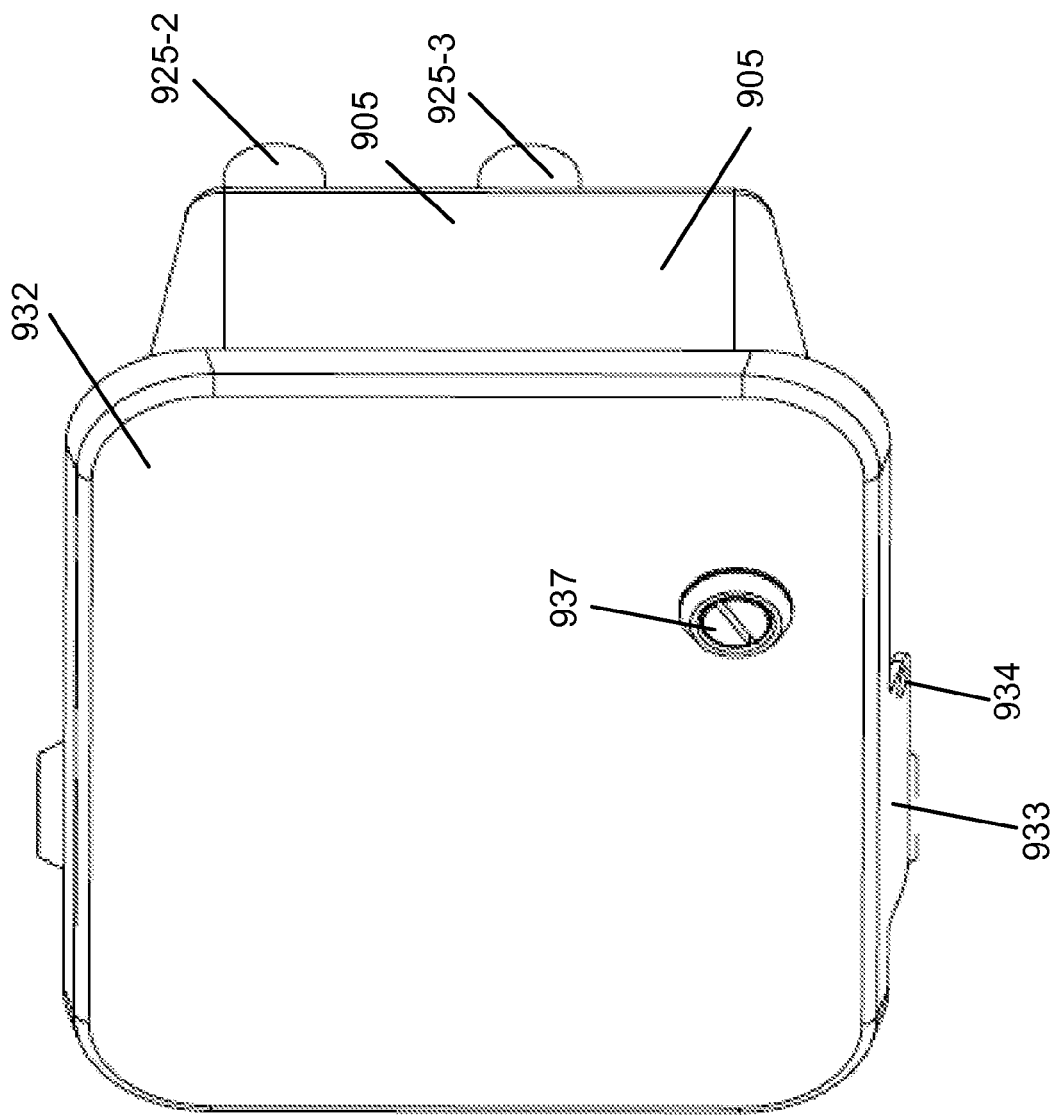
FIG. 17 is a diagram illustrating an isometric view of the electrical box in a closed configuration.

FIG. 16 is a diagram illustrating a side view of electrical box 900 in an open configuration. As previously described, a user may swivel plug 927, about fastener 928, to expose cutout portion 929, which in turn allows electrical cord 1301 to be fed into enclosure 905. FIG. 17 is a diagram illustrating an isometric view of electrical box 900 in a closed configuration. When electrical box 900 is in a closed configuration, lip portion 933 may prevent debris from entering enclosure 905.

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Spatially relative terms, such as "adjacent," above," "below," or other spatially relative term, may be used herein for ease of description to describe one element's or feature's relationship to another element or feature as illustrated in the figures. The spatially relative terms are intended to encompass different orientations of the electrical box in use or operation, in addition to the use or the operation depicted in the figures.

The foregoing description of embodiments provides illustration, but is not intended to be exhaustive or to limit the embodiments to the precise form disclosed. Accordingly, modifications to the embodiments described herein may be possible. Thus, although the invention has been described in detail above, it is expressly understood that it will be apparent to persons skilled in the relevant art that the invention may be modified without departing from the spirit of the invention. Various changes of form, design, number of, or arrangement may be made to the invention without departing from the spirit and scope of the invention. Therefore, the above-mentioned description is to be considered exemplary, rather than limiting, and the true scope of the invention is that defined in the following claims.

What is claimed is:

1. An electrical box comprising:
   a first compartment;
   a second compartment;
   a first access area that provides a passageway between the first compartment and the second compartment, the first compartment including a first conduit guide to guide a conduit from the first compartment to the second compartment via the first access area, wherein the first conduit guide engages the conduit upon installation to create a first drip point on the conduit, wherein the first drip point is below a location of the first access area; and
   a third compartment including a second conduit guide to guide another conduit from the third compartment to the second compartment, wherein the second conduit guide engages the other conduit upon installation to create a second drip point on the other conduit, the second drip point is below the location of the first access area.

2. The electrical box of claim 1, wherein the third compartment comprises:
   a second access hole that allows the other conduit to enter into the third compartment; and
   a sloped element that extends from the second access hole.

3. The electrical box of claim 1, wherein the second conduit guide extends substantially parallel to a wall of the electrical box.

4. The electrical box of claim 1, further comprising:
   a first cover to cover the first compartment; and
   a second cover to cover the second compartment.

5. The electrical box of claim 4, further comprising:
an electrical box cover to cover the first compartment, the second compartment, and the third compartment.

6. The electrical box of claim 4, the second cover comprising:
a first portion to cover the second compartment;
a second portion that includes a hole to receive a receptacle; and
a third portion, the first portion extending substantially parallel to the third portion.

7. The electrical box of claim 6, further comprising:
the receptacle, and wherein the first conduit guide includes a portion that extends substantially parallel to a partition that includes the access hole.

8. The electrical box of claim 1, the first compartment comprising: a third access hole to allow the conduit to be guided into the first compartment.

9. An enclosure comprising:
a first compartment; a second compartment; a cover that covers the first compartment and the second compartment; and a first access area that provides a passageway between the first compartment and the second compartment, the first compartment including a first conduit guide to guide a conduit from the first compartment to the second compartment via the first access area, wherein the first conduit guide creates a first drip point on the conduit, wherein the first drip point is below the first access area.

10. The enclosure of claim 9, further comprising:
a third compartment including a second conduit guide to guide another conduit from the third compartment to the second compartment, wherein the second conduit guide creates a second drip point with respect to the conduit, wherein the second drip point is below the first access area.

11. The enclosure of claim 10, wherein the third compartment comprises:
a second access hole that allows the other conduit to enter into the third compartment.

12. The enclosure of claim 10, wherein the second conduit guide extends substantially parallel to a wall of the enclosure and includes a notch to receive a latch of a cover for the enclosure.

13. The enclosure of claim 9, the first compartment comprising: a third access hole to allow the conduit to be guided into the first compartment.

14. The enclosure of claim 9, wherein the cover comprises a hole configured to receive a receptacle.

15. The enclosure of claim 9, further comprising:
a receptacle attached to a wall of the second compartment, and wherein a top wall of the enclosure includes downward sloped portions to form an inverted V-like configuration to permit liquid run-off.

16. The enclosure of claim 9, wherein the first conduit guide comprises:
a first guide portion;
a second guide portion; and
a third guide portion, wherein the first guide portion and the second guide portion are parallel to each other, and one of the second guide portion connects to the first guide portion and another end of the second guide portion connects to the third guide portion.

17. An equipment enclosure comprising:
a first compartment;
a second compartment, the first compartment including a first conduit guide to guide a conduit from the first compartment to the second compartment, wherein the first conduit guide creates a first drip point on the conduit that prevents a liquid from entering the second compartment; and
a third compartment including a second conduit guide to guide another conduit from the third compartment toward the second compartment, wherein the second conduit guide creates a second drip point on the other conduit that prevents a liquid from reaching the second compartment.

18. The equipment enclosure of claim 17, wherein the third compartment includes a conduit guide that extends perpendicular to the second conduit guide.

19. The equipment enclosure of claim 17, wherein the third compartment comprises:
a second access hole that allows the other conduit to be installed into the third compartment;
a cover that covers the first compartment and the second compartment; and
a divider that extends from a wall of the equipment enclosure and meets with the cover.

20. The equipment enclosure of claim 17, wherein a third conduit guide provides a partition between the first compartment and the second compartment and extends perpendicular from the second conduit guide.

* * * * *